United States Patent [19]

Golda et al.

[11] 4,171,974

[45] Oct. 23, 1979

[54] AQUEOUS ALKALI DEVELOPABLE NEGATIVE WORKING LITHOGRAPHIC PRINTING PLATES

[75] Inventors: Eugene Golda, Monsey; Alan Wilkes, Brewster, both of N.Y.

[73] Assignee: Polychrome Corporation, Yonkers, N.Y.

[21] Appl. No.: 878,110

[22] Filed: Feb. 15, 1978

[51] Int. Cl.$^2$ .......................... G03C 1/68; G03C 1/62
[52] U.S. Cl. ........................ 96/75; 96/86 P; 96/115 R; 96/67
[58] Field of Search ............... 96/86 P, 115 R, 75, 96/86 R, 67

[56] References Cited

U.S. PATENT DOCUMENTS

| 3,230,087 | 1/1966 | Sus et al. | 96/33 |
|---|---|---|---|
| 3,387,976 | 6/1968 | Sorkin | 96/86 P |
| 3,600,290 | 8/1971 | Fitko | 427/44 |
| 3,652,272 | 3/1972 | Thomas | 96/86 P |
| 3,679,419 | 7/1972 | Gillich | 96/91 R |
| 3,790,385 | 2/1974 | Steppan et al. | 96/75 |
| 3,861,917 | 1/1975 | Magnotta et al. | 96/115 P |
| 3,876,432 | 4/1975 | Carlick et al. | 96/115 R |
| 4,038,084 | 7/1977 | Nakano et al. | 96/86 P |
| 4,074,008 | 2/1978 | Green | 96/86 P |
| 4,100,321 | 7/1978 | Schlesinger et al. | 96/115 R |

*Primary Examiner*—Jack P. Brammer

[57] ABSTRACT negative working lithographic printing plates whose coating comprises the admixture of acrylated esters of epoxy resins with negative working lithographic sensitizers are formed, whereby the non-image areas are removable by aqueous alkali developers.

12 Claims, No Drawings

AQUEOUS ALKALI DEVELOPABLE NEGATIVE WORKING LITHOGRAPHIC PRINTING PLATES

BACKGROUND OF THE INVENTION

This invention relates to lithographic printing plates and, more particularly, to novel photosensitive coatings for negative working lithographic printing plates which, upon irradiation, are developable by aqueous alkaline solutions.

The art of lithographic printing depends upon the immiscibility of grease and water, upon the preferential retention of a greasy image-forming substance by an image area, and upon the similar retention of an aqueous dampening fluid by a non-image area. When a greasy image is imprinted upon a suitable surface and the entire surface is then moistened with an aqueous solution, the image area will repel the water and the non-image area will retain the water. Upon subsequent application of greasy ink, the image portion retains ink whereas the moistened non-image area repels it. The ink on the image area is then transferred to the surface of a material on which the image is to be reproduced, such as paper, cloth and the like, via an intermediary, a so-called offset or blanket cylinder, which is necessary to prevent mirror-image printing.

The type of lithographic plate to which the present invention is directed has a coating of a light-sensitive substance that is adherent to an aluminum base sheet. If the light-sensitive coating is applied to the base sheet by the manufacturer, the plate is referred to as a "presensitized plate." If the light-sensitive substance is applied to the base by the lighographer or trade platemaker, the plate is referred to as a "wipe-on" plate. Depending upon the nature of the photosensitive coating employed, the treated plate may be utilized to reproduce directly the image to which it is exposed, in which case it is termed a positive-acting plate, or to produce an image complementary to the one to which it is exposed, in which case it is termed a negative-acting plate. In either case the image area of the developed plate is oleophilic and the non-image area is hydrophilic.

In the case of a negative plate that is exposed to light through a negative transparency, the light-sensitive material, commonly a diazo compound, is caused to harden and thereby become insoluble in a desensitizing solution applied to the plates after light exposure for the purpose of removing that part of the light-sensitive coating which, because it was protected from the light by the negative, was not light-hardened. The light-hardened surface of a negative plate will be the oleophilic surface compatible with the greasy ink and is called the "image area;" the surface from which the non-hardened light-sensitive material has been removed by a desensitizer will be, or can be converted to, a hydrophilic surface having little affinity for the greasy ink and is called the "non-image" area.

A positive plate is generally one upon which the non-image area is the portion of the light-sensitive diazo compound exposed to light while the unexposed portion is either oleophilic or adapted to be converted by chemical reaction to a hardened oleophilic ink-receptive image area.

It is known in the art to produce positive working lithographic printing plates which may be developed with aqueous alkaline developers, however, to date negative type presensitized plates required organic solvent developers which are undesirable polluting agents.

SUMMARY OF THE INVENTION

As hereinbefore mentioned, the present invention provides negative working lithographic printing plates whose unexposed or non-image areas are developable by aqueous alkaline developer. Such a plate typically comprises a hydrophilic substrate having coated thereon a photosensitive composition comprising the admixture of a negative working lithographic photosensitizer and a resin which is an acrylated ester of an epoxy resin. Especially suitable of such photosensitizers is the reaction product of the condensation produce of paradiazo diphenyl amine and paraformaldehyde with 2,2-hydroxy(4-methoxy benzophenone)5-sulfonic acid. Preferred resins are styrene solutions of metha-acrylate esters of epoxy resins and diacrylate esters of liquid Bisphenol A epoxy resins.

It is, therefore, an object of the present invention to provide a negative working lithographic printing plate which is developable by aqueous alkaline solutions.

It is a further object of the present invention to provide a negative working lithographic printing plate which does not require the use of polluting organic solvents.

These and other objects of the instant invention will be in part discussed and in part apparent upon consideration of the detailed description of the preferred embodiment.

DETAILED DESCRIPTION OF THE PREFERRED EMBODIMENT

As the first step in the process of this invention, a sheet substrate, preferably aluminum and the alloys thereof especially those aluminum compositions suitable for the manufacture of lithographic printing plates such as Alcoa 3003 and Alcoa 1100 which may or may not have been pre-treated by standard graining and/or etching and/or anodizing techniques as are well known in the art, may be coated by spraying, brushing, dipping or other means with a composition suitable for use as an interlayer for lithographic plates. Standard metal substrate pretreatments include electrolytically anodizing in sulfuric, chromic, hydrochloric and/or phosphoric acids, electrolytically etching in hydrochloric or phosphoric acid, and chemical or mechanical graining by well known methods, which are all known to the skilled worker. Interlayer compositions employable in the practice of this invention include aqueous solutions of alkali silicate, silicic acid, polyacrylic acid, the alkali zirconium fluorides, such as potassium zirconium hexafluoride, or hydrofluozirconic acid in concentrations of 0.5% to 20% by volume. A preferred concentration range is from 3% to 8% and the most preferred range is from 4% to 5%.

Said substrate is then coated by means well known in the art with a photosensitive coating which comprises the admixture of a negative working lithographically suitable photosensitizer with a resin consisting of acrylated esters of epoxy resins.

The photosensitive composition of this invention is also capable of forming a photoresist by substituting a suitable non-electrically conducting substrate, such as silicon, for the metal sheet substrate.

Preferred negative working lithographic photosensitizers include photopolymers, water-insoluble diphenyl amine diazonium salts which have been condensed with a compound containing reactive carbonyl groups such as aldehydes and ketones. Such photosensitizers and condensation procedures are well known in the art as described in U.S. Pat. Nos. 3,219,447 and 3,591,575 which are incorporated herein by reference.

Useful light-sensitive diazonium compounds may be formed by reacting (1) a water-soluble, light sensitive diazonium compound selected from the group consisting of para-diazo-diphenylamine and the condensation product of para-diazo-diphenylamine with formaldehyde, formaldehyde zinc chloride or paraformaldehyde with (2) a hydroxyl-containing aromatic coupling agent selected from the group consisting of hydroxy-benzophenone which may be substituted by an additional hydroxy group or up to two lower alkoxy groups, diphenolic acid, resorcinol, naphtholsulfonamide, naphtholsulfonic acid and sulfonanthranilic acid in an inert aqueous reaction medium having a pH between about 1.5 and about 7.5 substantially to avoid resinification of the reaction product and loss of light-sensitivity of the diazonium group, forming said diazonium compound as a water-insoluble precipitate, and separating said precipitate from the reaction medium in a dry powder form.

In a number of preferred embodiments, said hydroxyl-containing aromatic coupling agent is: 2,4-dihydroxy-benzophenone; 2-hydroxy-4-methoxy-benzophenone; 2,2'-dihydroxy-4,4'-dimethoxybenzophenone; 2,2',4,4'-tetrahydroxy-benzophenone; sodium 2,2'-dihydroxy-4,4'-dimethoxy-5-sulfobenzophenone; 2-hydroxy-4-methoxy-benzophenone-5-sulfonic acid; a trihydrate of 2-hydroxy-4-methoxy-benzophenone-5-sulfonic acid.

A most preferred photosensitizer is the reaction product of para-diazo-diphenylamine as condensed with formaldehyde or paraformaldehyde and 2-hydroxy-4-methoxy benzophenone-5-sulfonic acid.

Resins useful in the context of the instant invention are acrylated esters of epoxy resins.

Preferred resins useful in the formation of the photosensitive coating of the present invention are styrene solutions of metha-acrylate esters of epoxy resins. These are available as Epocryl TM 321 and 322 resins available from the Shell Chemical Corporation and have the formula,

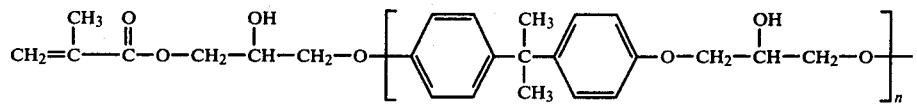
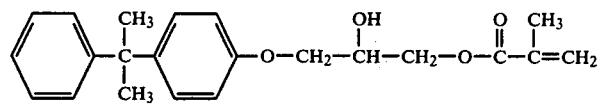

wherein n = 1 to 5.

Other preferred resins useful in this context include diacrylate esters of liquid Bisphenol A epoxy resins. These are available as Epocryl TM DRH-302 and 303 resins from the Shell Chemical Corporation and have the formula,

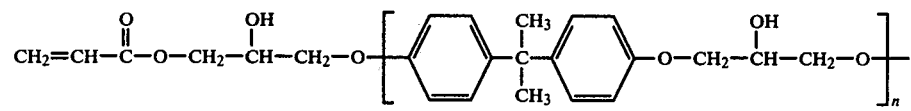
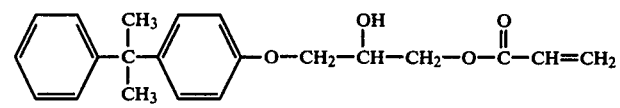

wherein n is 1 to 5.

A preferred ratio of photosensitizer to resin is one part by weight of photosensitizer to from about 0.5 to about 20.0 parts by weight of resin. A most preferred ratio is one part by weight of photosensitizer to from about 1 to about 8 parts by weight of resin. Minor amounts of other resins such as epoxies, polyesters and polyurethanes may optionally also be included in the photosensitive coating solution.

The coating solution is formed by dissolving both the photosensitizer and the resin in a suitable solvent system and subsequently evaporating the solvents. Examples of such solvents include methanol, methylene dichloride, Methyl Cellosolve TM, and n,n dimethyl formamide although others are also useable.

Said photosensitive composition when coated and dried on a suitable substrate may be exposed by methods well known in the art and developed to remove the unexposed non-image area by use of aqueous alkaline solutions. The solute of the aqueous alkaline developer may contain effective amounts of triethanol amine, monoethanolamine, sodium sulfite anhydrous, sodium lauryl sulfate, lithium benzoate or 1-heptyl, 2-imidazoline, β-ethoxy proponoic acid sodium salt although other aqueous alkaline developers may also be employed.

The following examples serve a non-limiting illustrations of the instant invention.

EXAMPLE 1

A sample of 3003 grade aluminum was mechanically grained and anodized by use of direct current in an 18% $H_2SO_4$ solution at 25 amp mins./ft.$^2$ at 90° F. Subsequently, this aluminum sheet was submersed in a 5% sodium silicate solution for 30 seconds at 180° F.

The above treated aluminum sheet was coated with the following composition in parts by weight:

1 part—of the condensation product of p-diazo diphenylamine with formaldehyde which was then reacted with 2,2-hydroxy, (4-methoxy benzophenone) 5-sulfonic acid
5 parts—styrene solution of metha-acrylate ester of epoxy resin (e.g. Epocryl Resin 321 available from Shell Chemical Corp.)
0.2 parts—basic blue dye
0.05 parts—methyl orange
dissolved in:
20 parts—methyl cellosolve
45 parts—methylene dichloride
30 parts—methanol The resulting photosensitive coating was exposed for 30 seconds through a standard lithographic negative on a 5 K.W. mercury vapor light source. The unexposed area was removed with an aqueous alkaline developer of the following composition in parts by weight:

3 parts—triethanolamine
0.2 parts—monoethanolamine
0.6 parts—sodium sulfite anhydrous
9 parts—sodium lauryl sulfate
87.2 parts—water
(pH=10.8)

The developer removed the unexposed photosensitive material from the non-printing areas leaving in the image areas a tough, oleophilic, ink-receptive coating formed by photoinitiated reactions caused by the exposure to U.V. light. This sample was run on a conventional web press for 250,000 successful impressions.

EXAMPLE 2

A sample of 3003 grade aluminum was treated as in Example 1. The resulting aluminum sheet was coated with the following composition in parts by weight:

1.5 parts—of the condensation product of p-diazo diphenylamine with formaldehyde which was then reacted with 2,2-hydroxy (4-methoxy benzophenone)5-sulfonic acid
4 parts—diacrylate ester of liquid bisphenol A epoxy resins (e.g. Epocryl Resin DRH 302 available from Shell Chemical Corp.)
0.3 parts—Orasol Red B dye
dissolved in:
50 parts—methyl cellosolve
10 parts—N,N dimethyl formamide
20 parts—methylene dichloride
15 parts—methanol The resulting photosensitive coating was exposed for 30 seconds through a standard lithographic negative on a 5 K.W. mercury vapor light source. The unexposed area was removed with an aqueous alkaline developer of the following composition in parts by weight:

20 parts—lithium benzoate
10 parts—1-heptyl,2-imidazoline,B-ethoxypropionic acid sodium salt
70 parts—water
pH=10.3

The developer removed the unexposed photosensitive material from the non-printing areas, leaving in the image areas a tough, oleophilic, ink-receptive coating formed by photoinitiated reactions caused by the exposure to U.V. light. This sample was run on a conventional sheet fed press for 125,000 impressions.

EXAMPLE 3

A sample of 1100 grade aluminum was electrochemically grained in a 2.5% HCl solution by methods well known in the art. This was then anodized in an 18% $H_2SO_4$ solution at 20 amp.min./ft.$^2$ at 90° F. Subsequently, this aluminum sheet was submersed in a 5% sodium silicate solution for 45 seconds at 180° F.

The above treated aluminum sheet was coated with the following composition in parts by weight:
0.5 parts—of the condensation product of p-diazo diphenylamine with formaldehyde which was then reacted with 2,2-ethoxy(4-methoxy benzophenone)5-sulfonic acid
2 parts—styrene solution of metha-acrylate ester of epoxy resin (e.g. Epocryl Resin 322, available from Shell Chemical Corp.)
1.5 parts—Polyester Resin (e.g. Hooker 19788 available from Hooker Chemical Co.)
0.2 parts—Calco Oil Blue
dissolved in:
20 parts—methyl cellosolve
45 parts—methylene dichloride
30 parts—methanol
3 parts—N,N dimethylformamide The resulting photosensitive coating was exposed for 30 seconds through a standard lithographic negative on a 5 K.W. mercury vapor light source. The unexposed area was removed with an aqueous alkaline developer as in Example 2.

The developer easily removed the unexposed photosensitive material from the non-printing area. This sample was run on a conventional sheet fed press for 65,000 impressions.

EXAMPLE 4

A sample of 3003 grade aluminum was mechanically grained and then chemically etched in a 25% $H_3PO_4$ solution at a 150 mg/ft.$^2$ metal removal etch rate. This was then anodized and silicated as in Example 1.

The above treated aluminum sheet was coated with the following composition in parts by weight:

1 part—of the condensation product of p-diazo diphenylamine with formaldehyde which was then reacted with 2,2-hydroxy (4-methoxy benzophenone)5-sulfonic acid
3 parts—styrene solution of metha-acrylate ester of epoxy resin (e.g. Epocryl Resin 321 available from Shell Chemical Corp.)
1.75 parts—epoxy resin (e.g. Epon 1031 available from Shell Chemical Corp.)
0.25 parts—polyurethane resin (e.g. Estane 5715 available from B. F. Goodrich Chemical)
0.2 parts—basic blue dye
0.05 parts—methyl orange
dissolved in:
60 parts—methylene dichloride
40 parts—methanol The resulting photosensitive coating was exposed to U.V. light as in Example 1. The unexposed area was removed with an aqueous alkaline developer as in Example 1.

The sample was exposed to accelerated shelf life testing which proved to have consistent good image producing quality after a simulated two and one-half year shelf life. A sample was run on a web press for

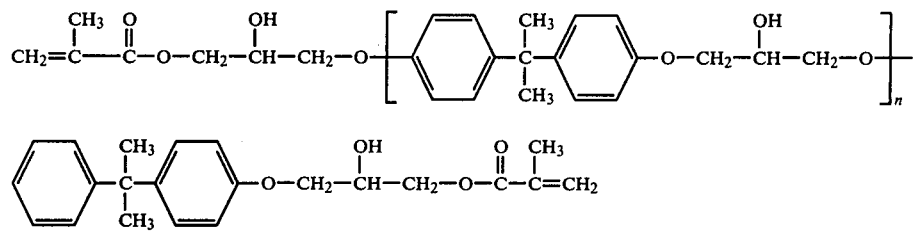

180,000 acceptable impressions.

EXAMPLE 5

A sample of 3003 grade aluminum was treated as in Example 1. This was then coated with the following

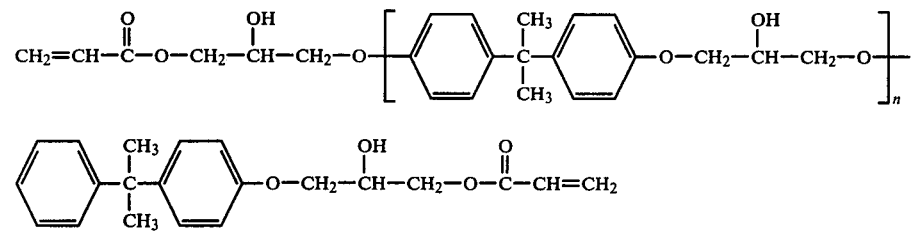

composition in parts by weight:

1 part—of the condensation product of p-diazo diphenylamine with formaldehyde which was then reacted with 2,2-hydroxy (4-methoxy benzophenone) 5-sulfonic acid
5 parts—diacrylate ester of liquid bisphenol A epoxy resins (e.g. Epocryl Resin DRH 303 available from Shell Chemical Corp.)
0.3 parts—Orasol Blue GN
dissolved in:
20 parts—methyl cellosolve
45 parts—methylene dichloride
30 parts—methanol The resulting photosensitive coating was exposed as in Example 1. The unexposed area was removed with an aqueous alkaline developer as in Example 1. This sample gave results similar to those found in Example 1.

It is, of course, to be understood that the foregoing disclosure and examples are intended to illustrate the invention and that numerous changes can be made in the conditions and proportions set forth without departing from the scope of the invention as defined in the claims appended hereafter.

We claim:

1. A photosensitive element which comprises a substrate having coasted thereon a photosensitive composition which comprises the admixture of effective amounts of a negative working lithographic diazonium photosensitizer and an acrylated ester of an epoxy resin.

2. The photosensitive element of claim 1 wherein the substrate is comprised of silicon.

3. The photosensitive element of claim 1 wherein the substrate is comprised of aluminum or the alloys thereof.

4. The photosensitive element of claim 1 wherein the resin is a styrene solution of metha acrylate esters of epoxy resins.

5. The photosensitive element of claim 1 wherein the resin is, wherein n=1 to 5.

6. The photosensitive element of claim 1 wherein the resin is a diacrylate ester of bisphenol A epoxy resin.

7. The photosensitive element of claim 1 wherein the resin is, wherein n is 1 to 5.

8. The photosensitive element of claim 1 wherein the lithographic photosensitizer comprises the reaction product of (1) a water-soluble, light-sensitive diazonium compound selected from the group consisting of para-diazo-diphenylamine and the condensation product of para-diazo-diphenylamine with formaldehyde, formaldehyde zinc chloride or paraformaldehyde with (2) a hydroxyl-containing aromatic coupling agent selected from the group consisting of hydroxy-benzophenone which may be substituted by an additional hydroxy group or up to two lower alkoxy groups, diphenolic acid, resorcinol, naphthol-sulfonamide, naphthosulfonic acid and sulfonanthranilic acid in an inert aqueous reaction medium having a pH between about 1.5 and about 7.5 substantially to avoid resinification of the reaction product and loss of light-sensitivity of the diazonium group, forming said diazonium compound as a water-insoluble precipitate, and separating said precipitate from the reaction medium in a dry powder form.

9. The photosensitive element of claim 1 wherein the ratio of lithographic photosensitizer to resin is in the range of from about 1:0.5 to about 1:20 parts by weight.

10. The photosensitive element of claim 1 wherein the aluminum surface has been grained.

11. The photosensitive element of claim 1 wherein the aluminum surface has been anodized.

12. The photosensitive element of claim 1 wherein there is disposed between said aluminum substrate and said photosensitive coating an interlayer composition selected from the group consisting of alkali silicate, silicic acid, polyacrylic acid and alkali zirconium fluorides.

* * * * *